US009123590B2

(12) United States Patent
Ma

(10) Patent No.: US 9,123,590 B2
(45) Date of Patent: Sep. 1, 2015

(54) ARRAY SUBSTRATE, DISPLAY DEVICE AND METHOD FOR FABRICATING ARRAY SUBSTRATE

(71) Applicants: BEIJING BOE DISPLAY TECHNOLOGY CO., LTD., Beijing (CN); BOE TECHNOLOGY GROUP CO., LTD., Beijing (CN)

(72) Inventor: Yu Ma, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/235,324

(22) PCT Filed: Dec. 6, 2013

(86) PCT No.: PCT/CN2013/088716
§ 371 (c)(1),
(2) Date: Jan. 27, 2014

(87) PCT Pub. No.: WO2014/190710
PCT Pub. Date: Dec. 4, 2014

(65) Prior Publication Data
US 2014/0353844 A1    Dec. 4, 2014

(30) Foreign Application Priority Data
May 30, 2013   (CN) .......................... 2013 1 0211057

(51) Int. Cl.
*H01L 23/48*    (2006.01)
*H01L 27/12*    (2006.01)

(52) U.S. Cl.
CPC .......... *H01L 27/124* (2013.01); *H01L 27/1259* (2013.01)

(58) Field of Classification Search
CPC ...................... H01L 27/124; H01L 27/1259
USPC .............. 257/59; 438/637; 345/204; 349/151
See application file for complete search history.

(56) References Cited

U.S. PATENT DOCUMENTS

2010/0201666 A1* 8/2010 Tobita ............................ 345/208
2012/0327057 A1* 12/2012 Sakamoto et al. ............. 345/211
2013/0038587 A1* 2/2013 Song et al. ..................... 345/211

FOREIGN PATENT DOCUMENTS

CN          103018991 A      4/2013
CN          103295516 A      9/2013

OTHER PUBLICATIONS

International Search Report Issued Feb. 27, 2014; Appln No. PCT/CN2013/088716.
Written Opinion of the International Searching Authority dated Feb. 18, 2014; PCT/CN2013/088716.

* cited by examiner

*Primary Examiner* — Shaun Campbell
(74) *Attorney, Agent, or Firm* — Ladas & Parry LLP

(57) ABSTRACT

An array substrate, a display device and a method for fabricating an array substrate are disclosed. The array substrate comprises at least two Gate Driver on Array (GOA) elements and a Start Vertical (STV) signal line, a transmission channel between two of the adjacent GOA elements is formed by a via hole and a gate metal layer or a source/drain metal layer; a forward via hole region and a backward via hole region are disposed on the array substrate; the forward via hole region is for disposing a forward via hole for forming a forward transmission channel connecting an output of $m^{th}$ GOA element and an input of $(m+1)^{th}$ GOA element, a connection point connecting to the STV signal line is disposed on the first GOA element; the backward via hole region is for disposing a backward via hole for forming a backward transmission channel connecting an output of $(m+1)^{th}$ GOA element and an input of $m^{th}$ GOA element, a connection point connecting to the STV signal line is disposed on the last GOA element; m is an integer no less than 1.

7 Claims, 3 Drawing Sheets

ARRAY SUBSTRATE, DISPLAY DEVICE AND METHOD FOR FABRICATING ARRAY SUBSTRATE

FIELD OF THE ART

Embodiments of the invention relate to the display field, more particularly, to an array substrate, a display device and a method for fabricating an array substrate.

BACKGROUND

In Gate Driver on Array (GOA) technology, the gate driver is integrated on the array substrate such that the disposition of additional drivers such as Chip On Film (COF) at the edge of the array substrate is omitted, which can not only facilitate compaction of the array substrate but also reduce the material cost as well as the fabrication process cost.

A GOA element corresponds to a gate line on the array substrate. Specifically, the output of a GOA element is connected to the gate line and simultaneously connected to the input of another GOA element which is connected with the next scanned gate line.

Currently there are two scan methods:

The first is forward scan, which starts from the proximate end of the array substrate and scans to the distal end, with respect to the Print Circuit Board (PCB).

The second one is backward scan, which starts from the distal end of the array substrate and scans to the proximate end, with respect to the PCB.

The internal configuration of the GOA elements and layout of via holes of the GOA elements for forward scanned array substrate and backward scanned substrate are quite different during the fabrication. In this case, when fabricating the substrate using the mask process, individual masks are substantially different from each other, which make the fabrication process of low compatibility, high fabrication and design cost.

SUMMARY

An objective of the invention is to provide an array substrate, a display device and a method for fabricating an array substrate which have strong compatibility with both forward and backward scanned array substrate, low production and design cost as well as good driving effect.

An aspect of the invention provides an array substrate which comprises at least two gate driver GOA elements and a start vertical STV signal line, a transmission channel between two of the adjacent GOA elements is formed by a via hole and a gate metal layer or by a via hole and a source/drain metal layer, wherein a forward via hole region and a backward via hole region are disposed on the array substrate;

the forward via hole region is for disposing a forward via hole which is configured for forming a forward transmission channel connecting an output of $m^{th}$ GOA element and an input of $(m+1)^{th}$ GOA element, a connection point connecting to the STV signal line is disposed on the first GOA element;

the backward via hole region is for disposing a backward via hole which is configured for forming a backward transmission channel connecting an output of the $(m+1)^{th}$ GOA element and an input of the $m^{th}$ GOA element, a connection point connecting to the STV signal line is disposed on the last GOA element;

wherein m=1, 2, 3 . . . M, M is the number of the GOA elements.

As an example, the forward via hole region is further for disposing a forward reset via hole which is configured for forming a forward reset channel connecting a reset of the $m^{th}$ GOA element and the output of the $(m+1)^{th}$ GOA element;

the backward via hole region is further for disposing a backward reset via hole which is configured for forming a backward reset channel connecting a reset of the $(m+1)^{th}$ GOA element and the output of the $m^{th}$ GOA element.

A second aspect of the invention provides a display device comprising the above array substrate.

A third aspect of the invention provides a method for fabricating an array substrate, which comprises a step of forming a forward via hole region and a backward via hole region on a substrate.

As an example, when the array substrate is fabricated for forward scan, disposing a forward via hole for forming a forward transmission channel connecting an output of $m^{th}$ GOA element and an input of $(m+1)^{th}$ GOA element in the forward via hole region by using a via hole mask process, a connection point connecting to an STV signal line is disposed on the first GOA element;

when the array substrate is fabricated for backward scan, disposing a backward via hole for forming a backward transmission channel connecting an output of the $(m+1)^{th}$ GOA element and an input of the $m^{th}$ GOA element in the backward via hole region by using a via hole mask process, a connection point connecting to an STV signal line is disposed on the last GOA element;

wherein m=1, 2, 3 . . . M, M is the number of the GOA elements.

As an example, when the array substrate is fabricated for forward scan, disposing a forward reset via hole for forming a forward reset channel connecting a reset of the $m^{th}$ GOA element and the output of the $(m+1)^{th}$ GOA element in the forward via hole region by using a via hole mask process;

when the array substrate is backward scanned, disposing a backward reset via hole for forming a backward reset channel connecting a reset of the $(m+1)^{th}$ GOA element and the output of the $m^{th}$ GOA element in the backward via hole region using a via hole mask process.

As an example, the via hole mask process is a via hole mask process of a 4 mask process or a 5 mask process.

According to the array substrate, the display device and the method for fabricating the array substrate, a forward via hole region and a backward via hole region are pre-reserved on the same array substrate; as a result, the production processes for the forward and backward scanned array substrates have good compatibility, little design variation and low production cost. Moreover, the same batch of products can be conveniently and timely changed to the array substrates scanned in the other way according to the production requirement. Meanwhile, the structural difference between the forward and backward scanned array substrates is small and the driving effect is good.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

Figure 1:
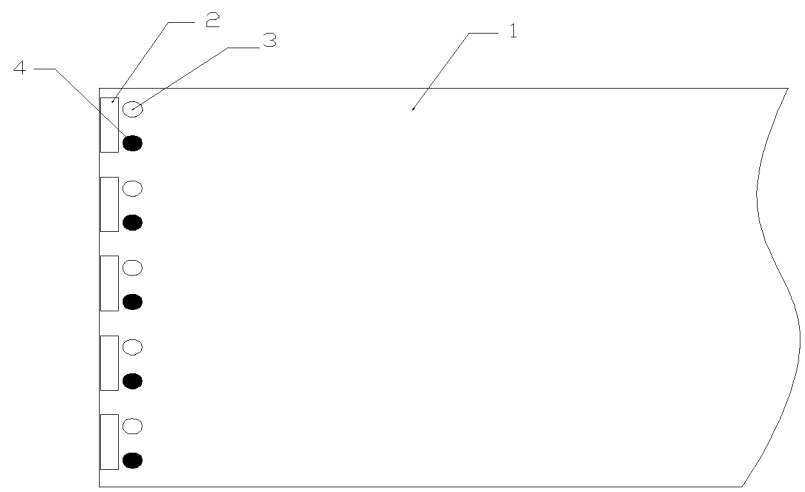
FIG. 1 schematically illustrates a partial configuration of an array substrate in accordance with Embodiment 1 of the invention.

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Embodiment 1

As illustrated in FIGS. 1, 2, 4 and 5, an array substrate 1 comprises at least two gate driver (GOA) elements 2 and a start vertical (STV) signal line. A transmission channel between two adjacent GOA elements 2 is formed by a via hole 3',4' and a gate metal layer 5 or formed by a via hole 3',4' and a source/drain (S/D) metal layer 6. A pixel matrix, gate lines and data lines are disposed on the array substrate, the GOA elements 2 are driving elements providing voltages to gate lines respectively connected thereto according to a time sequence. A previous GOA element on the array substrate is connected to the gate metal layer 5 by way of a via hole, and a next GOA element is also connected to the gate metal layer by way of a via hole, thereby forming a transmission channel between the two GOA elements. In another embodiment, the transmission channel may also be formed by connecting to the S/D metal layer by way of a via hole.

Forward via hole regions 3 and backward via hole regions 4 are disposed on the array substrate (the number of forward and backward via hole regions decided by the number of GOA elements).

Figure 2:
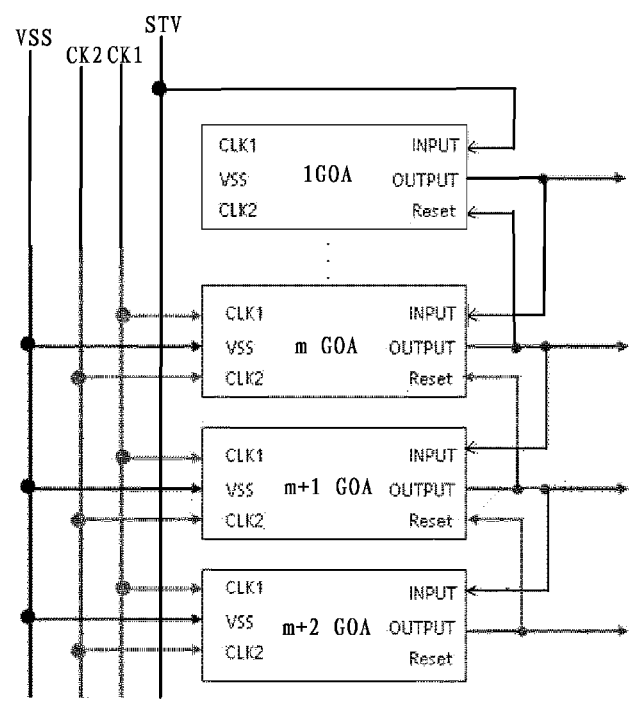
FIG. 2 illustrates a signal flow chart during forward scan of the array substrate of Embodiment 1 of the invention.

As illustrated in FIGS. 1 and 2, when the array substrate 1 is forward scanned, the forward via hole region 3 is for disposing a forward via hole, which is configured for forming a forward transmission channel connecting the output terminal OUTPUT of the $m^{th}$ GOA element and the input terminal INPUT of the $(m+1)^{th}$ GOA element, a connection point connecting to the STV signal line is disposed on the first GOA element; wherein m is a positive integer equal or greater than 1, for example, m=1, 2, 3 . . . M, wherein the maximum value M is the number of the GOA elements.

Figure 3:
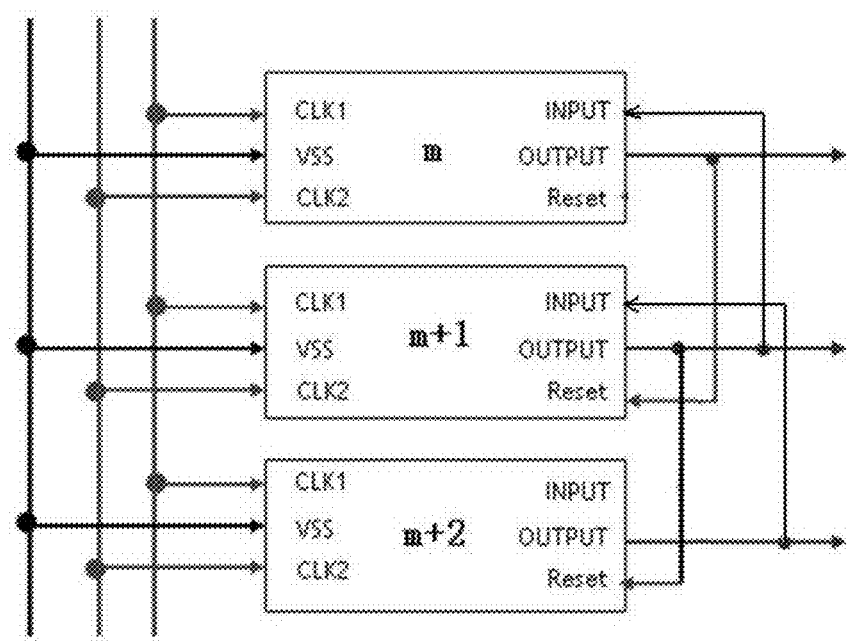
FIG. 3 illustrates a signal flow chart during backward scan of the array substrate of Embodiment 1 of the invention.
Figure 4:
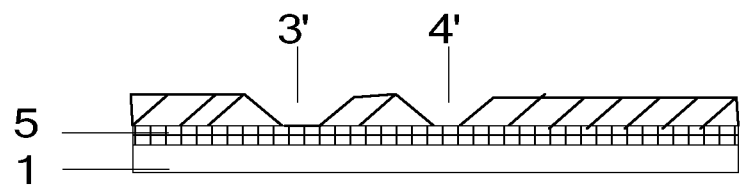
FIG. 4 is a schematic structural section view of an array substrate in an example in accordance with Embodiment 1 of the invention.
Figure 5:
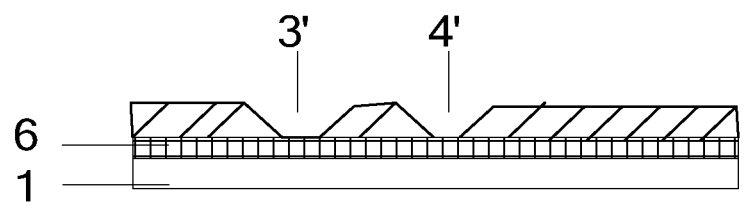
FIG. 5 is a schematic structural section view of an array substrate in another example in accordance with Embodiment 1 of the invention.

As illustrated in FIGS. 1 and 3, when the array substrate 1 is backward scanned, the backward via hole region 4 is for disposing a backward via hole, which is configured for forming a backward transmission channel connecting the output terminal OUTPUT of the $(m+1)^{th}$ GOA element and the input terminal INPUT of the $m^{th}$ GOA element, a connection point connecting to the STV signal line is disposed on the last GOA element.

In the embodiment, the first GOA element is a GOA element proximate to the PCB, the last GOA element is the one distal to the PCB. That is, the numbering of the GOA elements is done from the end proximate to the PCB to the end distal to the PCB.

According to the embodiment, both the forward via hole region and the backward via hole region are pre-reserved on the array substrate at the same time. By this means, the backward scanned array substrate and the forward scanned array substrate are different from each other only in the positions of the via holes during production processes, which helps to improve the process compatibility. The variation in design the forward scanned array substrate and backward scanned array substrate become small, thereby simplifying the design and saving the design cost. When switching from producing the forward scanned array substrate to producing the backward scanned array substrate, it needs only to change the via hole position, which makes it easy to switch the production line. In summary, the array substrate in accordance with the embodiment of the invention has the advantages of low production and design cost, and little difference between the forward and backward scanned array substrate, by pre-reserving the forward and backward via hole regions on the array substrate.

As an improvement to the embodiment, as illustrated in FIGS. 1 and 2, when the array substrate 1 is forward scanned, the forward via hole region 3 is further configured for disposing a forward reset via hole for forming a forward reset channel connecting the reset terminal Reset of the $m^{th}$ GOA element and the output terminal OUTPUT of the $(m+1)^{th}$ GOA element.

Alternatively, as illustrated in FIGS. 1 and 3, when the array substrate 1 is backward scanned, the backward via hole region 4 is further configured for disposing a backward reset via hole for forming a backward reset channel connecting the reset terminal Reset of the $(m+1)^{th}$ GOA element and the output terminal OUTPUT of the $m^{th}$ GOA element.

The configuration of the forward via hole allows the forward transmission of the STV frame start signal from the end proximate to the PCB to the end distal to the PCB along the vertical start STV signal line, and the configuration of the backward via hole allows the transmission of the STV frame start signal from the end distal to the PCB to the end proximate to the PCB.

The configuration of the forward reset via hole allows the output signal of a next scanned GOA element at the end distal to the PCB to trigger the reset of a previous scanned GOA element at the end proximate to the PCB.

The configuration of the backward reset via hole allows the output signal of a next scanned GOA element at the end proximate to the PCB to trigger the reset of a previous scanned GOA element at the end distal to the PCB.

The array substrate of the embodiment pre-reserves spaces for both the forward and backward via hole regions at the same time, which facilitates the fabrication process, reduces the fabrication and design cost and has the advantages of being convenient.

In FIGS. 2 and 3, CLK1 is an input terminal for inputting a first clock signal to the GOA element, VSS is a low voltage input terminal, and CKL2 is an input terminal for inputting a second clock signal to the GOA element.

Embodiment 2

A display device according to the embodiment comprises the array substrate of Embodiment 1.

An example of the display device is a liquid crystal display (LCD) device, wherein the array substrate and an opposed substrate are disposed opposite to each other to form a liquid crystal cell, in which a liquid crystal material is filled. The opposed substrate is for example a color filter substrate. A pixel electrode of each pixel element of the array substrate is controlling the rotation degree of the liquid crystal material by applying an E-field to display images. As an example, the LCD device further comprises a backlight source for providing backlight for the array substrate.

Another example of the display device is an organic light-emitting diode (OLED), wherein an organic light-emitting material lamination is formed on the array substrate, a pixel electrode of each pixel element functions as an anode or cathode for driving the organic light-emitting material to emit light to display images.

Still another example of the display device is an E-paper device, wherein an E-ink layer is formed on the array substrate, a pixel electrode of each pixel element is adapted for applying a voltage to drive the charged particles in the E-ink to move so as to display images.

Embodiment 3

A method for fabricating an array substrate according to the embodiment comprises a step of forming a forward via hole region and a backward via hole region.

When the array substrate is fabricated for forward scan, a forward via hole for forming a forward transmission channel connecting the output of the $m^{th}$ GOA element and the input of the $(m+1)^{th}$ GOA element is disposed in the forward via hole region using a via hole mask process, a connection point connecting to the STV signal line is disposed on the first GOA element.

When the array substrate is fabricated for backward scan, a backward via hole for forming a backward transmission channel connecting the output of the $(m+1)^{th}$ GOA element and the input of the $m^{th}$ GOA element is disposed in the backward via hole region using a via hole mask process, a connection point connecting to the STV signal line is disposed on the last GOA element.

Wherein m=(1, 2, 3 . . . M), M is the number of the GOA elements.

In fabricating the array substrate of the invention using fabrication processes such as a patterning process, it differs from a conventional method for fabricating array substrates in that: the method for fabricating the array substrate of the invention has to pre-reserve two regions on the array substrate, one is the forward via hole region for disposing the forward via hole and the other is the backward via hole region for disposing the backward via hole. With respect to the array substrate fabricated according to the method of the embodiment, the backward scanned array substrate and the forward scanned array substrate are different from each other only in the positions of the via holes. The array substrate therefore has the advantages of having good process compatibility, low fabrication and design cost. In order to achieve good process compatibility between array substrates scanned with the two methods and reduce the structural difference between the forward and backward scanned array substrates, a conventional method inverts the transistor set M3 and the transistor set M4 in the GOA element to form two different array substrates scanned forwardly or backwardly. However, such method is only suitable for small-sized array substrates. As for large-sized array substrates, the difference between the transistor set M3 and the transistor set M4 is significant, and serious driving defect will be generated on the backward scanned array substrate when fabricating the array substrate by simple exchanging the transistor sets.

In summary, the array substrate fabricated by the method according to the embodiment of the invention and the array substrate of the invention has the advantages of good process compatibility in fabricating the forward and backward scanned array substrates, low production and design cost, and good driving effect.

Embodiment 4

The method for fabricating the array substrate according to the embodiment further limits the via hole mask process to a via hole mask process of a 4 mask process or a 5 mask process.

The 4 mask process or 5 mask process has the advantages of low fabrication cost and easy fabrication. The forward and backward scanned array substrates fabricated by the method of the embodiment have little structural differences and no difference in the internal structure of the GOA element. As a result, the fabrication process has good compatibility, the fabrication and design cost is low and the driving effect is good.

What are described above is related to the illustrative embodiments of the disclosure only and not limitative to the scope of the disclosure; the scopes of the disclosure are defined by the accompanying claims.

What is claimed is:

1. An array substrate, comprising at least two Gate Driver on Array (GOA) elements and a start vertical (STV) signal line, a transmission channel between two of the adjacent GOA elements is formed by a via hole and a gate metal layer or by a via hole and a source/drain metal layer, wherein a forward via hole region and a backward via hole region are disposed on the array substrate;

the forward via hole region is for disposing a forward via hole which is configured for forming a forward transmission channel connecting an output of $m^{th}$ GOA element and an input of $(m+1)^{th}$ GOA element, a connection point connecting to the STV signal line is disposed on the first GOA element;

the backward via hole region is for disposing a backward via hole which is configured for forming a backward transmission channel connecting an output of the $(m+1)^{th}$ GOA element and an input of the $m^{th}$ GOA element, a connection point connecting to the STV signal line is disposed on the last GOA element;

wherein m=1, 2, 3 . . . M, M is the number of the GOA elements.

2. The array substrate of claim 1, wherein the forward via hole region is further for disposing a forward reset via hole which is configured for forming a forward reset channel connecting a reset of the $m^{th}$ GOA element and the output of the $(m+1)^{th}$ GOA element;

the backward via hole region is further for disposing a backward reset via hole which is configured for forming a backward reset channel connecting a reset of the $(m+1)^{th}$ GOA element and the output of the $m^{th}$ GOA element.

3. A display device comprising the array substrate of claim 1.

4. A method for fabricating an array substrate, comprising a step of forming a forward via hole region and a backward via hole region on a substrate;

wherein when the array substrate is fabricated for forward scan, disposing a forward via hole for forming a forward transmission channel connecting an output of $m^{th}$ GOA element and an input of $(m+1)^{th}$ GOA element in the forward via hole region by using a via hole mask process, a connection point connecting to an STV signal line is disposed on the first GOA element;

when the array substrate is fabricated for backward scan, disposing a backward via hole for forming a backward transmission channel connecting an output of the $(m+1)^{th}$ GOA element and an input of the $m^{th}$ GOA element in the backward via hole region by using a via hole mask process, a connection point connecting to an STV signal line is disposed on the last GOA element;

wherein m=1, 2, 3 . . . M, M is the number of the GOA elements.

5. The method of claim 4, wherein when the array substrate is fabricated for forward scan, disposing a forward reset via hole for forming a forward reset channel connecting a reset of the No. m GOA element and the output of the $m^{th}$ GOA element in the forward via hole region by using a via hole mask process;

when the array substrate is backward scanned, disposing a backward reset via hole for forming a backward reset channel connecting a reset of the $(m+1)^{th}$ GOA element and the output of the $m^{th}$ GOA element in the backward via hole region using a via hole mask process.

6. The method of claim 4, wherein the via hole mask process is a via hole mask process of a 4 mask process or a 5 mask process.

7. The method of claim 5, wherein the via hole mask process is a via hole mask process of a 4 mask process or a 5 mask process.

* * * * *